(12) United States Patent
Kim et al.

(10) Patent No.: US 11,742,367 B2
(45) Date of Patent: Aug. 29, 2023

(54) I-TOF PIXEL CIRCUIT FOR BACKGROUND LIGHT SUPPRESSION

(71) Applicants: SK hynix Inc., Icheon (KR); UNIST(ULSAN NATIONAL INSTITUTE OF SCIENCE AND TECHNOLOGY), Ulsan (KR)

(72) Inventors: Seong Jin Kim, Gwangmyeong (KR); Da Hwan Park, Incheon (KR)

(73) Assignees: SK hynix Inc., Icheon (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 127 days.

(21) Appl. No.: 17/531,599

(22) Filed: Nov. 19, 2021

(65) Prior Publication Data

US 2022/0399385 A1    Dec. 15, 2022

(30) Foreign Application Priority Data

Jun. 9, 2021 (KR) .......................... 10-2021-0075011

(51) Int. Cl.
   *H01L 27/146* (2006.01)
   *H04N 13/271* (2018.01)
   (Continued)

(52) U.S. Cl.
   CPC ..... *H01L 27/14609* (2013.01); *H04N 13/271* (2018.05)

(58) Field of Classification Search
   CPC ............ H01L 27/14609; H04N 13/271; H04N 25/705; H04N 25/445; H04N 25/745;
   (Continued)

(56) References Cited

U.S. PATENT DOCUMENTS 11,467,264 B2 * 10/2022 Choi .................... G01S 7/4865
2018/0234107 A1   8/2018 Venkataraman et al.
(Continued)

FOREIGN PATENT DOCUMENTS

JP        2020161992 A      10/2020

OTHER PUBLICATIONS

Chae et al., "A 64x64 APD-Based ToF Image Sensor with Background Light Suppression up to 200 klx Using In-Pixel Auto-Zeroing and Chopping", 2019 Symposium on VLSI Circuits Digest of Technical Papers, pp. C256 and C257 (Year: 2019).*

(Continued)

*Primary Examiner* — Albert H Cutler

(57) ABSTRACT

A pixel circuit for background light suppression includes: a 2-tap pixel circuit including first and second pixel capacitors, first and second storage switches, and first and second transfer switches; an in-pixel sigma delta circuit including a plurality of switching switches and a storage capacitor for storing charge transferred from the first and second pixel capacitors; an adaptive sigma delta controller configured to determine switching states of the plurality of switching switches according to a first state of the first pixel capacitor, or a second state of the second pixel capacitor, or both; and a chopping controller configured to instruct the storage switches and the transfer switches of the 2-tap pixel circuit to be selectively switched according to an output of the adaptive sigma delta controller.

17 Claims, 8 Drawing Sheets

(51) Int. Cl.
    *G01S 7/4863*    (2020.01)
    *G01S 7/487*     (2006.01)
    *G01S 17/894*    (2020.01)
    *H04N 25/705*    (2023.01)
    *H04N 25/445*    (2023.01)
    *H04N 25/71*     (2023.01)
    *H04N 25/75*     (2023.01)

(58) Field of Classification Search
    CPC ...... H04N 25/75; H04N 25/70; H04N 25/703; H04N 25/77; H04N 25/771; H04N 25/704; G01S 7/4863; G01S 7/4876; G01S 17/894; G01S 7/4914; G01S 17/89
    See application file for complete search history.

(56)           References Cited

U.S. PATENT DOCUMENTS

2019/0204446 A1*   7/2019   Ding .................... G01S 7/4865
2021/0356598 A1*  11/2021   Hurwitz ............... G01S 7/4861

OTHER PUBLICATIONS

Ahn et al., "Indirect Time-of-Flight CMOS Image Sensor With On-Chip Background Light Cancelling and Pseudo-Four-Tap/Two-Tap Hybrid Imaging for Motion Artifact Suppression", Nov. 2020, IEEE Journal of Solid-State Circuits, vol. 55, No. 11, pp. 2849-2865 (Year: 2020).*

* cited by examiner

SIGNAL (#1)

SIGNAL (#1)

I-TOF PIXEL CIRCUIT FOR BACKGROUND LIGHT SUPPRESSION

CROSS-REFERENCE TO RELATED APPLICATION

This application claims priority under 35 U.S.C. § 119 to Korean Patent Application No. 10-2021-0075011 filed on Jun. 9, 2021, which is incorporated herein by reference in its entirety.

BACKGROUND

1. Field

The present disclosure relates to a pixel circuit capable of effectively suppressing background light incident from the outside of an indirect time-of-flight (I-TOF) pixel by adaptively operating according to the intensity of the background light, and to a circuit technology of securing the reliability a depth image obtained by mounting such a circuit for each pixel.

2. Discussion of the Related Art

Recently, with the development of a semiconductor technology, functions of IT devices with built-in cameras have become more diversified. Technologies of acquiring and processing images using charge coupled devices (CCD) or CMOS image sensor (CIS) devices have also been rapidly developed. Among technologies of acquiring three-dimensional images, time-of-flight (TOF) techniques have been widely used recently. The TOF refers to a method of measuring the time required until light emitted from a light source is reflected from a subject and returns to the light source, calculating a distance between the light source and the subject, and acquiring a depth image. Among the TOF techniques, a method of calculating a distance by a difference between the time when light has departed from a light source and the time when the light reflected from a subject has reached a sensor located near the light source is called a direct TOF method. Since the speed of light is constant, it is easy to simply calculate a distance between a light source and a subject by finding a time difference. However, this method has the following disadvantages. Since light travels 30 centimeters in one nanosecond, a resolution of picoseconds smaller than nanosecond is required in order to obtain a depth image of the subject. However, it is somewhat difficult to handle the resolution of picoseconds at the current operating speed of semiconductor devices.

In order to solve such a problem, an indirect TOF (I-TOF) method, which is an indirect method, has been developed. This is a method in which light is modulated into a signal with a specific frequency for transmission, and when the modulated signal reflected from a subject has reached a sensor, a phase difference between the two signals is detected to calculate the distance to the subject. The modulation method may use a pulse signal or a sine wave as needed. In the case of the pulse signal, the blinking period of light is changed according to an on and off operation period. For example, in the case of a 20 MHz pulse signal, light blinks repeatedly at intervals of 50 nanoseconds.

However, the I-TOF method also has several issues. The first issue is that it is affected by background light such as sunlight or indoor light. The background light is also stored in each pulse signal period operated for each phase on a reception side. Since the background light has different stored values, it needs to be appropriately subtracted to escape from the influence of the background light. However, this process needs to be performed accurately. Another issue is that when the influence of the background light is relatively large, a reception-side sensor may be pre-saturated and not receive a proper signal. That is, the light amount of a photodiode constituting the sensor may be full, so it is not possible to receive a light signal from a subject.

SUMMARY

The technical problem to be solved by embodiments of the present disclosure is to appropriately remove background light so that pixels are substantially prevented from being saturated by the background light when an I-TOF camera is used.

Another technical problem to be solved by embodiments of the present disclosure is to reduce the influence of background light when a depth image of a subject is acquired using an I-TOF camera.

An embodiment of the present disclosure for solving the above problems is an I-TOF pixel circuit for background light suppression, which includes: a 2-tap pixel circuit including pixel capacitors, storage switches, and transfer switches formed by being branched into two taps from the photodiode; an in-pixel sigma delta circuit including a storage capacitor for storing charge transferred from the pixel capacitors and switching switches for the storage; an adaptive sigma delta controller configured to determine switching states of the switching switches according to states of the pixel capacitors; and a chopping controller configured to instruct the storage switches and the transfer switches of the 2-tap pixel circuit to be selectively switched according to an adaptive operation of the adaptive sigma delta controller.

DETAILED DESCRIPTION

Figure 1:
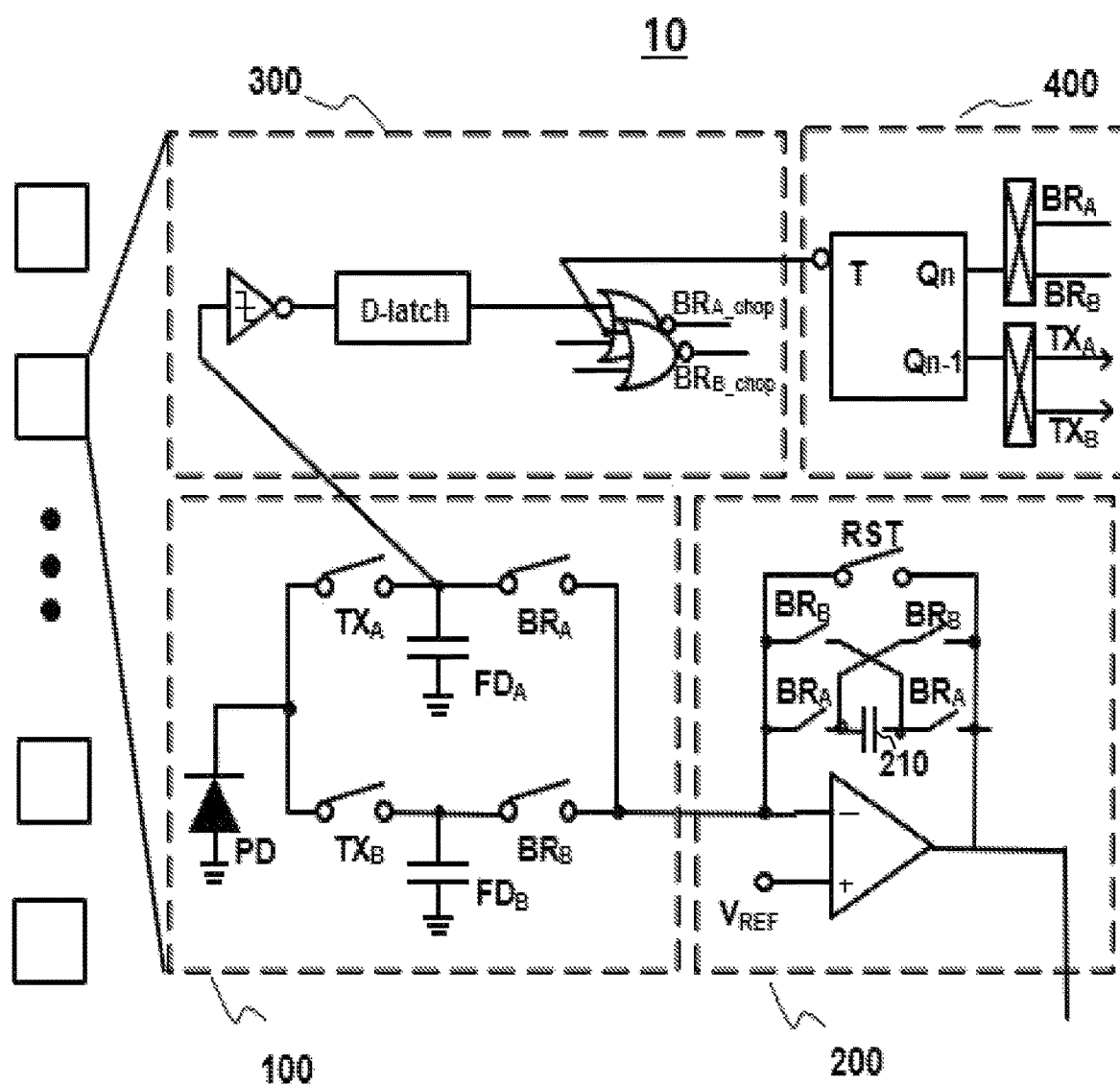
FIG. 1 is a diagram schematically illustrating a device including a pixel circuit according to an embodiment of the present disclosure.

Hereinafter, embodiments of the present disclosure will be described in detail with reference to the accompanying drawings such that embodiments of the present disclosure can be easily carried out by those skilled in the art to which the present disclosure pertains. The same reference numerals among the reference numerals in each drawing indicate the same members.

In the description of embodiments of the present disclosure, when detailed descriptions of related known technologies may obscure the subject matter of the present disclosure, detailed descriptions thereof may be omitted for the interest of brevity.

The terms such as first and second may be used to describe various components, but the components are not limited by the terms, and the terms are used only to distinguish one component from another component.

Hereinafter, embodiments of the present disclosure will be described with reference to the related drawings.

As illustrated in FIG. 1, a pixel circuit 10 according to an embodiment of the present disclosure includes a photodiode PD, a tap pixel circuit (e.g., a 2-tap pixel circuit) 100 including pixel capacitors $FD_A$ and $FD_B$ and related switches formed by being branched into two taps from the photodiode PD, an in-pixel sigma delta circuit 200, an adaptive sigma delta controller (e.g., an adaptive sigma delta control circuit) 300, and a chopping controller (e.g., a chopping control circuit) 400. The 2-tap pixel circuit 100 stores charge, which is transferred from the photodiode PD, by using a switch pair to which signals $TX_A$, $BR_A$, $TX_B$, and $BR_B$ are applied, or transfers the charge to other circuits. The in-pixel sigma delta circuit 200 differentiates charge stored in pixel capacitors $FD_A$ and $FD_B$ and accumulates the differentiated charge in a storage capacitor $C_{INT}$(210). The adaptive sigma delta controller 300 monitors a voltage of the pixel capacitor, starts to operate when the value of the voltage decreases below a certain level, and stores its operation state in an internal latch (e.g., a latch 310 in FIG. 9). The chopping controller 400 changes the phases of the signals $TX_A$ and $TX_B$ applied to the switches of the 2-tap pixel circuit 100 and removes a difference between the two taps when the adaptive sigma delta controller 300 operates. A detailed circuit operation will be described below.

Figure 2:
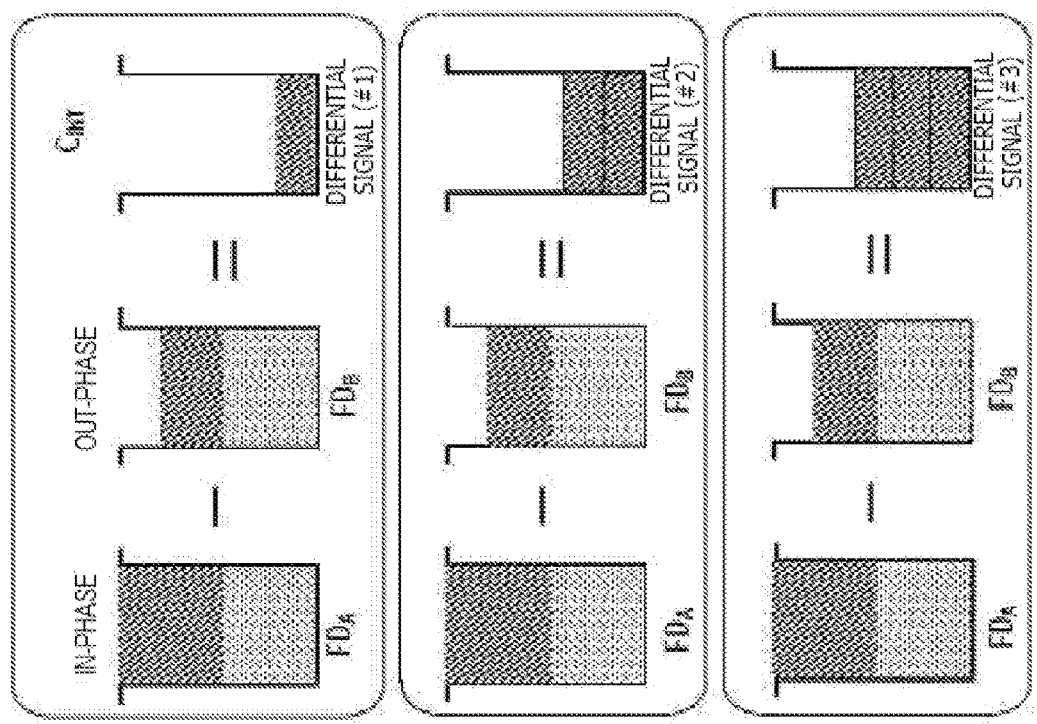
FIG. 2 is a diagram for explaining that a differential signal of a storage capacitor is stored according to an embodiment.
Figure 2:
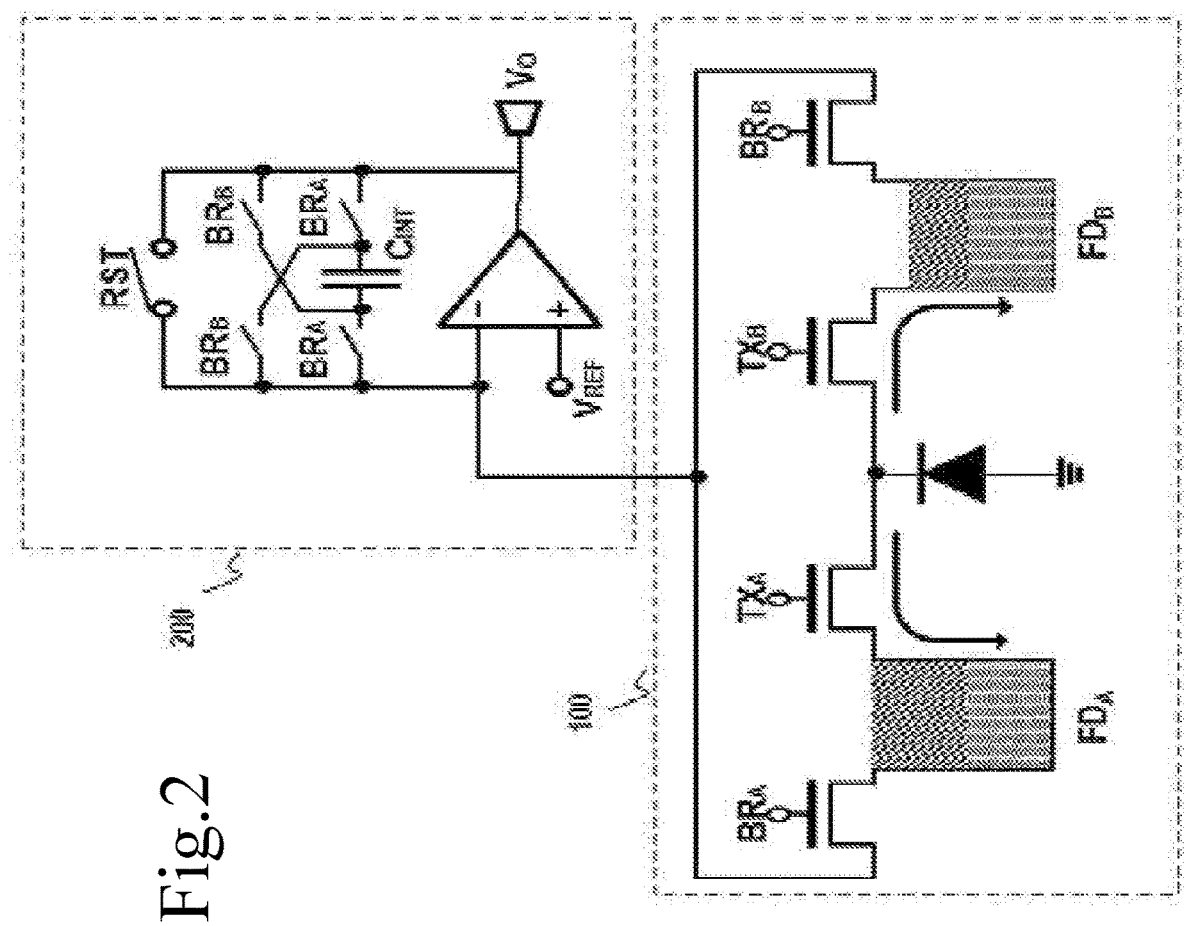

In order to effectively remove charge due to background light, several switching operations may be performed. FIG. 2 is a diagram for explaining operations of the 2-tap pixel circuit 100 and the in-pixel sigma delta circuit 200. For convenience of description, the pixel capacitors $FD_A$ and $FD_B$ are illustrated in the form of baskets capable of storing charge, instead of symbols. Furthermore, for the sake of convenience, throughout the specification of the present disclosure, the respective switches are distinguished from each other by signals for controlling them. In the embodiment shown in FIG. 2, during an in-phase, charge, in which a background light component and a subject component are added, is stored in the pixel capacitor $FD_A$ by a first storage switch that is turned on by a first signal $TX_A$. During an out-phase, charge, in which the background light component and the subject component are added, is stored in the pixel capacitor $FD_B$ by a second storage switch that is turned on by a second signal $TX_B$. However, although the background light components stored in both capacitors $FD_A$ and $FD_B$ are substantially the same, the amount of charge stored in the in-phase period and the amount of charge stored in the out-phase period may vary depending on a distance to the subject. In the embodiment of FIG. 2, it is assumed that charge in the in-phase period is larger than that in the out-phase period. When a charge component due to the background light is not excluded in a timely manner, the pixel capacitor $FD_A$ or $FD_B$ may be saturated and thus may not store a charge component due to the subject in successive cycles. FIG. 2 illustrates that charge stored in the pixel capacitors $FD_A$ and $FD_B$ is subtracted from each other through three steps and an effective charge component due to the subject, that is, a differential signal is accumulated in a storage capacitor $C_{INT}$(210) of the in-pixel sigma delta circuit 200 over three times (#1 to #3). More detailed operations will be described below.

Figure 3:
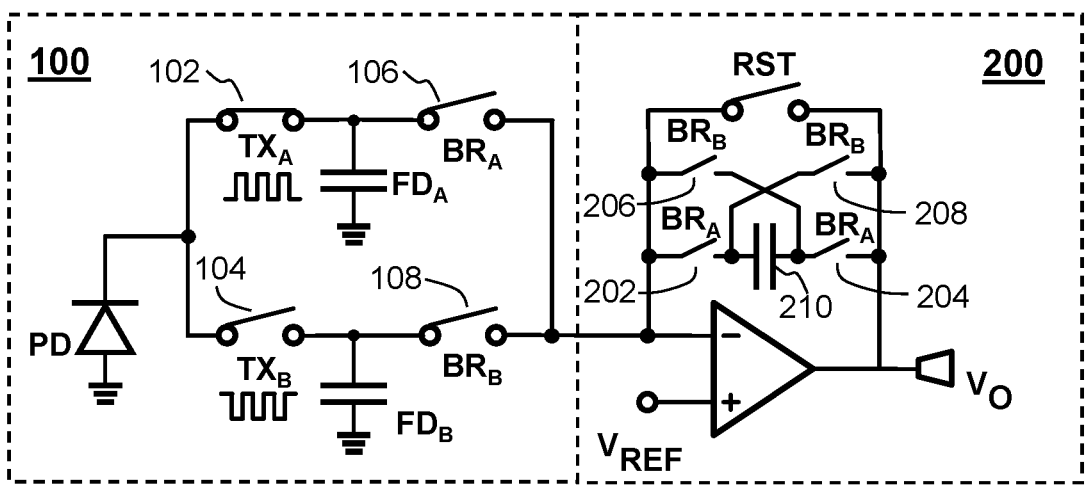
FIG. 3 is a diagram illustrating an operation of a 2-tap pixel circuit and an in-pixel sigma delta circuit during a first sub-integration period, according to an embodiment.

An order in which charge is stored in the pixel capacitors $FD_A$ or $FD_B$ and a related operation thereof will be described with reference to the diagram of a first sub-integration (sub-integration #1) period of FIG. 3. FIG. 3 illustrates the 2-tap pixel circuit 100 and the in-pixel sigma delta circuit 200 according to an embodiment. It is preferable that first and second storage switches 102 and 104, to which the signals (e.g., first and second charging signals) $TX_A$ and $TX_B$ are respectively applied, are operated by pulse signals with different phases, for example, phases inverted by 180°. Specifically, the first and second charging signals $TX_A$ and $TX_B$ may be complementary pulse signals having substantially the same period and a phase difference of 180° therebetween. During a period in which the first storage switch 102, to which the first charging signal $TX_A$ is applied, is turned on, charge transferred from a photodiode PD is stored in the first pixel capacitor $FD_A$. For example, during an on-period in each cycle of the first charging signal $TX_A$, the first storage switch 102 may be turned on and a current from the photodiode PD may flow into the first pixel capacitor $FD_A$ through the first storage switch 102, thereby storing charge in the first pixel capacitor $FD_A$ during the on-period. In the same principle, during a period in which the second storage switch 104, to which the second charging signal $TX_B$ is applied, is turned on, the charge transferred from the photodiode PD is stored in the second pixel capacitor $FD_B$. During this period, all the switches 202, 204, 206, and 208 of the in-pixel sigma delta circuit 200 are turned off, so the storage capacitor $C_{INT}$(210) is isolated.

Figure 4:
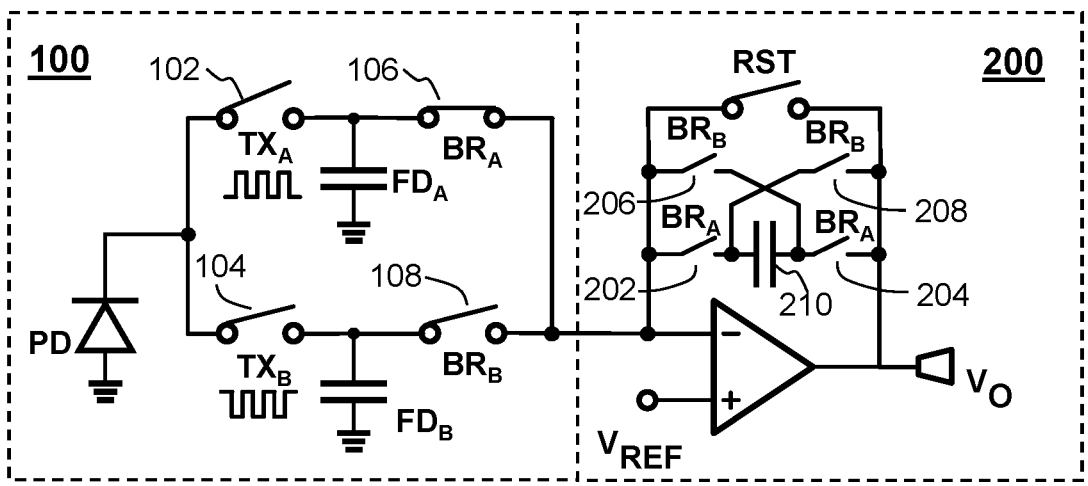
FIG. 4 is a diagram for explaining an operation of the 2-tap pixel circuit and the in-pixel sigma delta circuit during an in-phase signal sampling period, according to an embodiment.

Next, as illustrated in FIG. 4, during a first signal sampling period (e.g., an in-phase signal sampling period) according to an embodiment, a first transfer switch 106 of the 2-tap pixel circuit 100 is turned on by receiving a first transfer signal $BR_A$ and transfers the charge stored in the capacitor $FD_A$ to the storage capacitor $C_{INT}$(210) of the in-pixel sigma delta circuit 200. Second and third transfer switches 202 and 204 in the in-pixel sigma delta circuit 200 receive the signal $BR_A$ and are turned on to enable charge transfer. At this time, an output voltage Vo of the in-pixel sigma delta circuit 200 is expressed by Equation 1 below.

$$V_O = V_{REF} + \frac{C_{FD_A}}{C_{INT}}(V_{SIG1} + V_{BL}) \qquad \text{Equation 1}$$

In Equation 1 above, $V_O$ denotes the output voltage of the in-pixel sigma delta circuit 200, $V_{REF}$ denotes a reference voltage, $V_{SIG}$ denotes an effective signal component transferred from the photodiode PD, and $V_{BL}$ denotes a background light component. As described above, the same signals $BR_A$ and $BR_B$ are applied to the transfer switches in the 2-tap pixel circuit 100 and the transfer switches in the in-pixel sigma delta circuit 200. For example, the first transfer signal $BR_A$ may be applied to the first transfer switch 106 of the 2-tap pixel circuit 100 as well as the second and third transfer switches 202 and 204 of the in-pixel sigma delta circuit 200.

Figure 5:
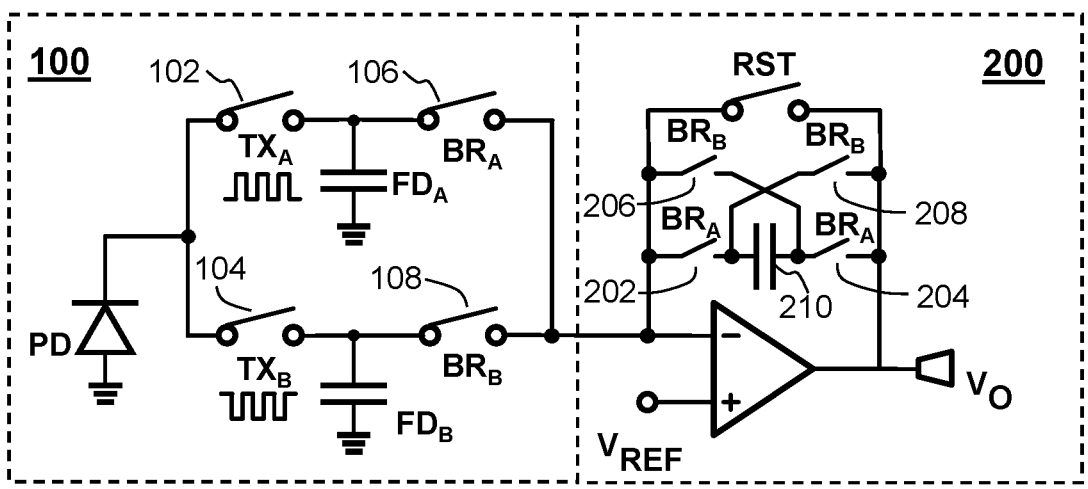
FIG. 5 is a diagram for explaining an operation of the 2-tap pixel circuit and the in-pixel sigma delta circuit during an out-phase signal sampling period, according to an embodiment.

FIG. 5 illustrates a second signal sampling period (e.g., an out-phase signal sampling period) according to an embodiment.

In this period, a fourth transfer switch 108 of the 2-tap pixel circuit 100 is turned on by receiving the second transfer signal $BR_B$ and transfers the charge stored in the second pixel capacitor $FD_B$ to the storage capacitor $C_{INT}$ (210) of the in-pixel sigma delta circuit 200. At this time, especially, the second and third transfer switches (or switching switches) 202 and 204 in the in-pixel sigma delta circuit 200 are turned off by the first transfer signal $BR_A$, whereas fifth and sixth transfer switches (or switching switches) 206 and 208 are turned on by the second transfer signal $BR_B$.

Thus, the connection between both electrodes of the storage capacitor $C_{INT}$(210) is reverse to that in the previous period. For example, during the out-phase signal sampling period shown in FIG. 5, a first end of the storage capacitor $C_{INT}$(210) is coupled to an output node at which the output voltage Vo is generated through the sixth transfer switch 208 and a second end of the storage capacitor $C_{INT}$(210) is coupled to the second pixel capacitor $FD_B$ through the fourth transfer switch 108 and the fifth transfer switch 206. In contrast, during the in-phase signal sampling period shown in FIG. 4, the first end of the storage capacitor $C_{INT}$(210) is coupled to the first pixel capacitor $FD_A$ through the first and second transfer switches 106 and 202 and the second end of the storage capacitor $C_{INT}$(210) is coupled to the output node through the third transfer switch 204.

By this reverse connection, charge stored in the storage capacitor $C_{INT}$(210) in the previous period is subtracted. Therefore, at this time, the output voltage Vo of the in-pixel sigma delta circuit 200 is expressed by Equation 2 below.

$$V_O = V_{REF} + \frac{C_{FD_A}}{C_{INT}}(V_{SIG1} + V_{BL}) - \frac{C_{FD_B}}{C_{INT}}(V_{SIGZ} + V_{BL}) \qquad \text{Equation 2}$$

Figure 6:
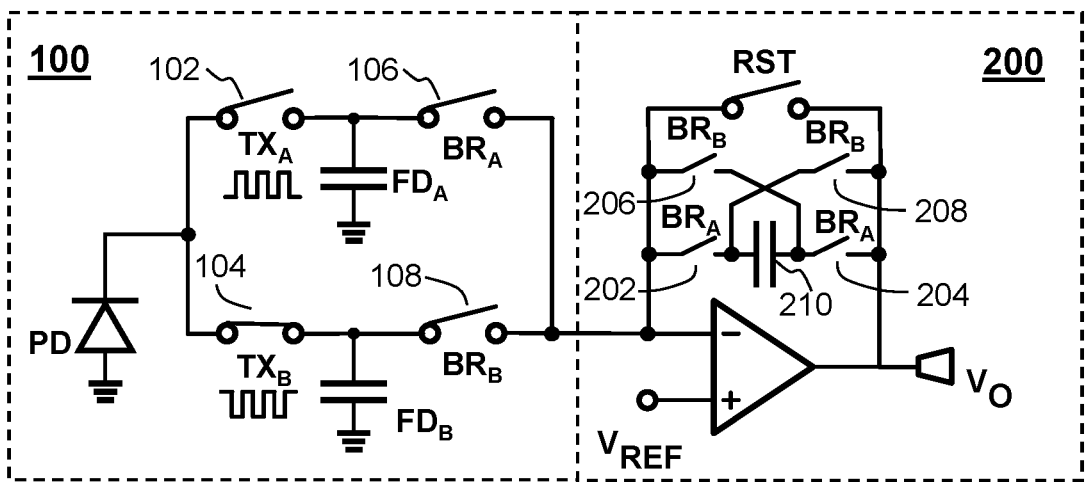
FIG. 6 is a diagram for explaining an operation of the 2-tap pixel circuit and the in-pixel sigma delta circuit during a second sub-integration period, which is affected by a chopping controller, according to an embodiment.

An operation in which in-phase charge is stored in the capacitor $FD_B$ in the 2-tap pixel circuit 100 by performing a chopping function according to an embodiment will be described with reference to FIG. 6. FIG. 6 illustrates a second sub-integration period in which the signals $TX_A$ and $TX_B$ are reversed and applied by performing the chopping function, so that the photodiode charge in the in-phase period is stored in the second pixel capacitor $FD_B$ and the charge in the out-phase period is stored in the first pixel capacitor $FD_A$. During this period, all the switches 202, 204, 206, and 208 of the in-pixel sigma delta circuit 200 are turned off, so the storage capacitor $C_{INT}$(210) is isolated.

Figure 7:
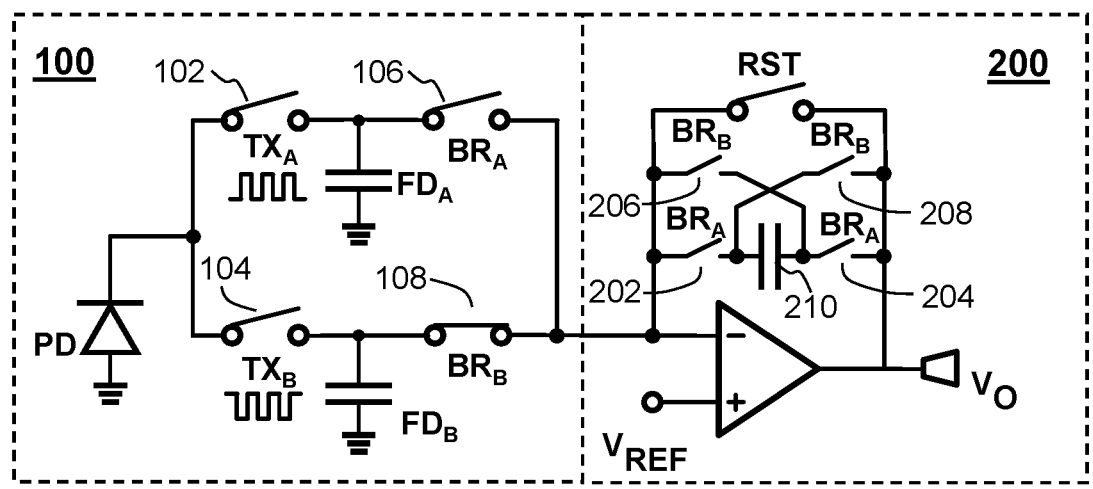
FIG. 7 is a diagram for explaining an operation of the 2-tap pixel circuit and the in-pixel circuit sigma delta circuit during an in-phase signal sampling period, which is affected by chopping, according to an embodiment.

The next operation corresponds to an in-phase signal sampling period as illustrated in FIG. 7 according to an embodiment. The fourth transfer switch 108 of the 2-tap pixel circuit 100, to which the first transfer signal $BR_A$ is applied, is turned on and transfers the charge stored in the capacitor $FD_B$ to the storage capacitor $C_{INT}$(210) of the in-pixel sigma delta circuit 200, and the second and third transfer switches 202 and 204 in the in-pixel sigma delta circuit 200, to which the first transfer signal $BR_A$ is applied, is turned on to enable charge transfer. At this time, the output voltage of the in-pixel sigma delta circuit 200 is expressed by Equation 3 below.

$$V_O = V_{REF} + \frac{C_{FD_A}}{C_{INT}}(V_{SIG1} + V_{BL}) - \frac{C_{FD_B}}{C_{INT}}(V_{SIGZ} + V_{BL}) + \frac{C_{FD_B}}{C_{INT}}(V_{SIG1} + V_{BL}) \qquad \text{Equation 3}$$

Figure 8:
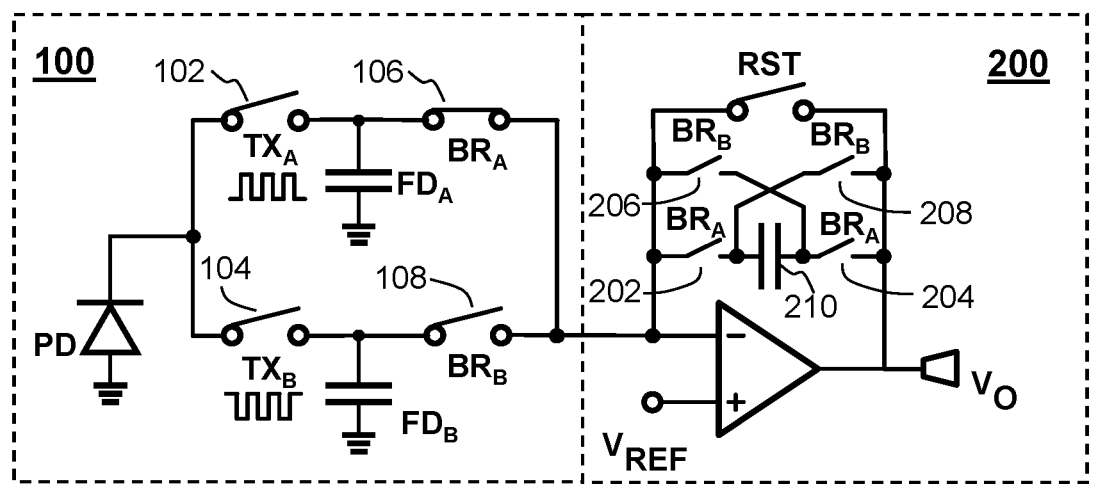
FIG. 8 is a diagram for explaining an operation of the 2-tap pixel circuit and the in-pixel sigma delta circuit during an out-phase signal sampling period, which illustrates that electrode connection of an in-pixel storage capacitor is reversed, according to an embodiment.

FIG. 8 illustrates an out-phase signal sampling period according to an embodiment. In this period, the first transfer switch 106 of the 2-tap pixel circuit 100, to which the signal $BR_B$ is applied, is turned on and transfers the charge stored in the capacitor $FD_A$ to the storage capacitor $C_{INT}$(210) of the in-pixel sigma delta circuit 200. At this time, especially, the second and third transfer switches 202 and 204 in the in-pixel sigma delta circuit 200, to which the signal $BR_A$ is applied, are turned off, whereas the fifth and sixth transfer switches 206 and 208, to which the signal $BR_B$ is applied, are turned on. Thus, the connection between both electrodes of the storage capacitor $C_{INT}$(210) is reverse to that in the previous period. By this reverse connection, charge stored in the storage capacitor $C_{INT}$(210) in the previous period is subtracted. Therefore, at this time, the output voltage of the in-pixel sigma delta circuit 200 is expressed by Equation 4 below.

$$V_O = V_{REF} + \frac{C_{FD_A}}{C_{INT}}(V_{SIG1} + V_{BL}) - \frac{C_{FD_B}}{C_{INT}}(V_{SIGZ} + V_{BL}) + \frac{C_{FD_B}}{C_{INT}}(V_{SIG1} + V_{BL}) - \frac{C_{FD_A}}{C_{INT}}(V_{SIGZ} + V_{BL}) \qquad \text{Equation 4}$$

At this time, it can be seen that the terms associated with the background light component $V_{BL}$ in Equation 4 are canceled even though the sizes of the FD capacitors are different from each other, so that the background light component $V_{BL}$ is removed.

From the above operations and Equations, it can be seen that the background light component $V_{BL}$ is appropriately removed and an effective image component from the subject may be left.

Figure 9:
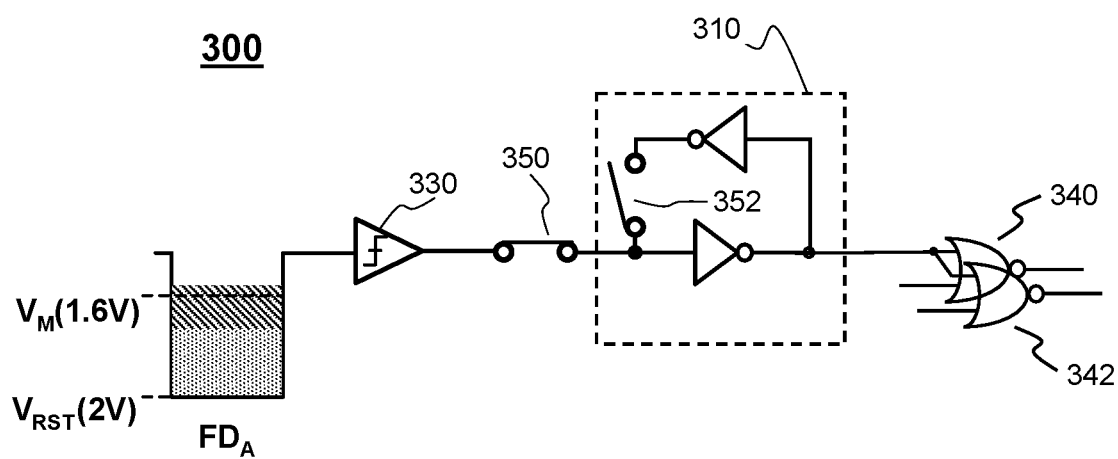
FIG. 9 is a diagram for explaining an operation of an adaptive sigma delta circuit according to an embodiment.
Figure 9:
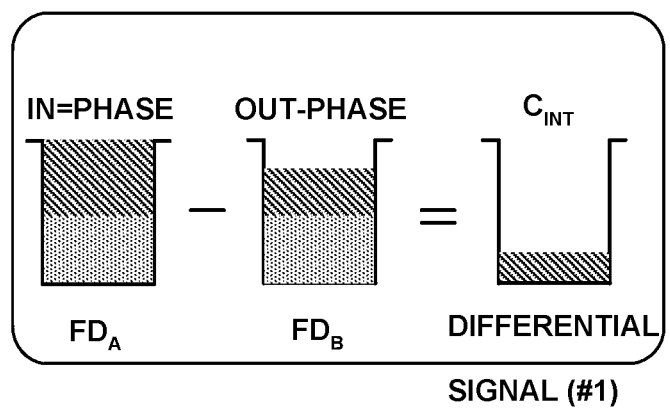

Next, an operation of the adaptive sigma delta controller 300 according to an embodiment will be described with reference to the circuit diagram of FIG. 9. The input of the adaptive sigma delta controller 300 is connected to one of the pixel capacitors $FD_A$ and $FD_B$ of the 2-tap pixel circuit 100. Although the embodiment shown in FIG. 9 shows that the adaptive sigma delta controller 300 determines switching states of a plurality of switches (e.g., the switches 202, 204, 206, and 208 of the in-pixel sigma delta circuit 200) according to a first state of the first pixel capacitor $FD_A$, embodiments of the present disclosure are not limited thereto. For example, the adaptive sigma delta controller 300 may determine switching states of the plurality of switches according to both the first state of the first pixel capacitor $FD_A$ and the second state of the second pixel capacitor $FD_B$. For convenience of description, FIG. 9 illustrates that the capacitor $FD_A$ in the form of a basket stores charge therein. When the charge is an electron, the potential will decrease as more electrons are accumulated. Thus, the sum of charge (dotted) due to the background light component and charge (back slashed) due to an effective component associated with the subject is illustrated in the basket $FD_A$ as the total amount of charge based on the voltage (or reset voltage) of 2V at the time of reset. In a comparator 330, a threshold voltage value for changing the output state thereof may be appropriately set. For example, in a case where the threshold voltage is set to 1.6 V, when the voltage becomes equal to or less than 1.6 V by the charge accumulated in the capacitor, the comparator 330 changes its output state. If the comparator 330 is configured as an inverter circuit, its output state is changed from low to high. The changed value is stored in the latch 310 and the adaptive sigma delta controller 300 instructs to perform a sigma delta operation. In an embodiment, a pair of NOR gates 340 and 342 each have a first input that receives an output of the latch 310 and a second input that receives an inverted version of a corresponding one of the first and second transfer signals $BR_A$ and $BR_B$, thereby outputting a corresponding one of the first and second transfer signals $BR_A$ and $BR_B$ when the output state of the comparator 330 is high. This causes a plurality of chain operations including the first sub-integration operation and the second sub-integration operation as described above, thereby allowing a differential signal excluding the background light component to be stored in the storage capacitor $C_{INT}$(210). Particularly, when the background light component is relatively large, a charge amount of the capacitor $FD_A$ due to the accumulated charge may be likely to exceed a threshold value corresponding to the threshold voltage (e.g., 1.6 V), so that aforementioned operations may be caused.

Figure 10:
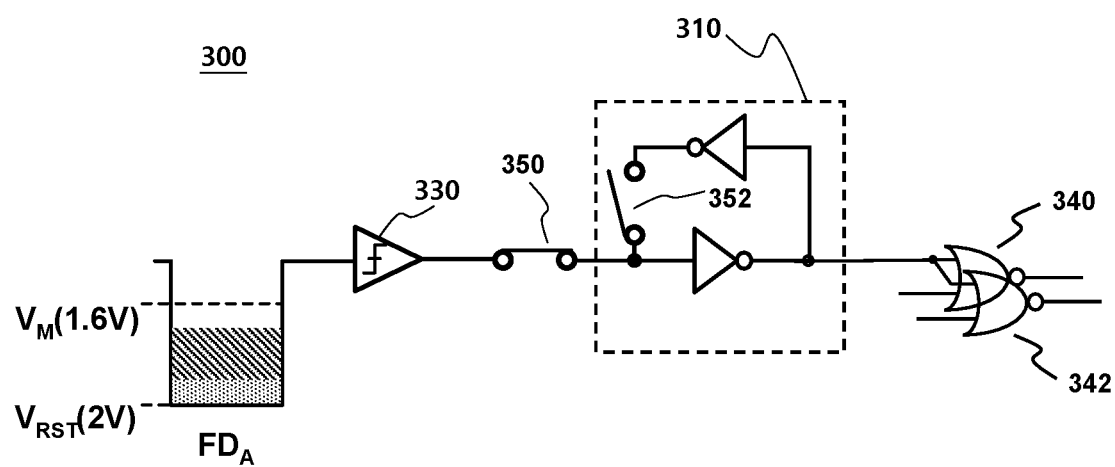
FIG. 10 is a diagram for explaining an operation of the adaptive sigma delta circuit according to an embodiment.
Figure 10:
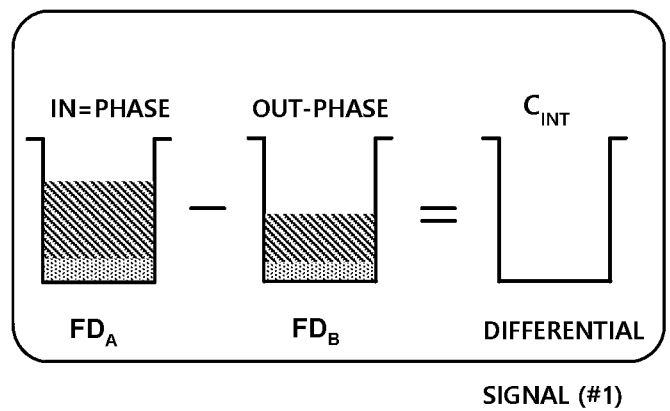

FIG. 10 illustrates a case where the pixel capacitor is unlikely to be saturated because the background light component is not relatively large. In the pixel capacitor $FD_A$, even though the charge (dotted) due to the background light component is added to that due to the effective component (back slashed) associated with the subject based on the voltage of 2V at the time of reset, it may not reach 1.6 V which is the threshold voltage. Specifically, a charge amount of the capacitor $FD_A$ due to the accumulated charge may not exceed a threshold value corresponding to 1.6V. Therefore, there is no change in the output state of the comparator 330 and the adaptive sigma delta controller 300 does not perform the sigma delta operation. This does not cause the operation of the in-pixel sigma delta circuit 200 after the first sub-integration period described above, so that charge remains in the pixel capacitor and no differential signal is stored in the storage capacitor. This may reduce a signal-to-noise ratio (SNR) due to noise caused by the resistance of the switch when the charge stored in the pixel capacitor is transferred to the storage capacitor, thereby preventing distance accuracy from being reduced. Specifically, according to an embodiment of the present disclosure, one or more pixel circuits that are unlikely to be saturated due to relatively small background light component may not perform switching operations in the 2-tap pixel circuit 100 and the in-pixel sigma delta circuit 200. As a result, noise that is associated with the switching operations and deteriorates accuracy in measuring the distance may be reduced, and thus distance accuracy may be improved to obtain a high-quality depth image of a subject.

The chopping controller 400 is activated and starts to operate when the adaptive sigma delta controller 300 instructs to perform the sigma delta operation for removing the background light. For this reason, the pixel capacitors $FD_A$ and $FD_B$ in the 2-tap pixel circuit 100 may alternately store charge under the control of the chopping controller 400.

Figure 11:
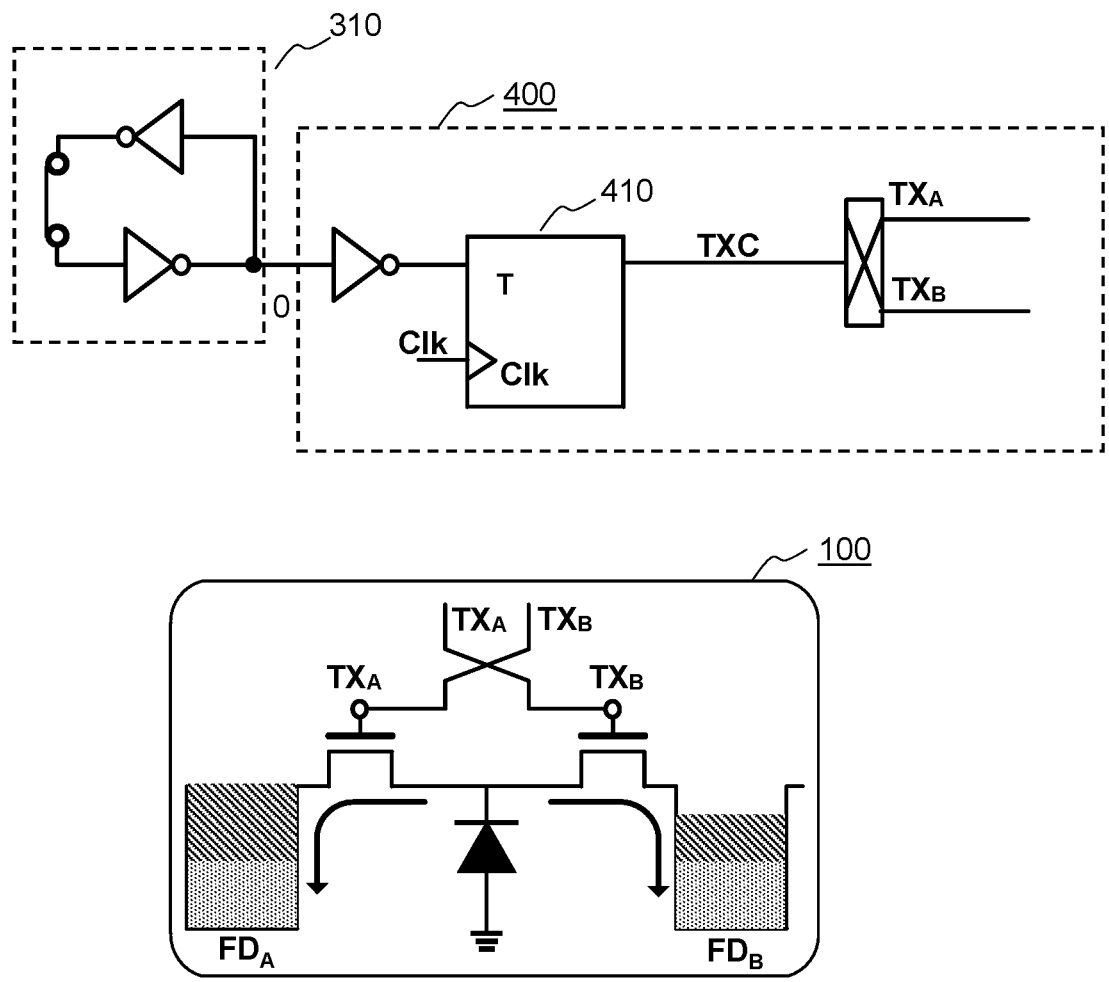
FIG. 11 is a diagram for explaining an operation of the chopping controller that controls switching of the 2-tap pixel circuit according to an embodiment.

FIG. 11 illustrates the flow of charge transferred from the photodiode to the pixel capacitors $FD_A$ and $FD_B$ and stored therein by such a chopping operation, according to an embodiment. In FIG. 11, transfer switches, to which the signals $BR_A$ and $BR_B$ for controlling the chopping controller 400 are applied, are omitted for the sake of convenience. As described above, the chopping controller 400 is activated only when the sigma delta operation is performed because the background light component is relatively large, and is deactivated when the sigma delta operation is not performed because the background light component is relatively small, so that the signals $TX_A$ and $TX_B$ are not reversed. For example, when the background light component is sufficiently large to make the comparator 330 of the adaptive sigma delta controller 300 generate a logic high value (e.g., "1") and the latch 310 of the adaptive sigma delta controller 300 output a logic low value (e.g., "0"), a flip-flop (e.g., a toggle flip-flop) 410 of the chopping controller 400 may receive a logic high value "1" as an input to generate a chopping control signal TXC changing its state in response to an edge (e.g., a rising edge) of a clock signal Clk. As a result, the chopping controller 400 may reverse the first and second charging signals $TX_A$ and $TX_B$. In contrast, when the background light component is relatively small, the chopping control signal TXC output from the flip-flop 410 of the chopping controller 400 may keep its state, and thus may not reverse the first and second charging signals $TX_A$ and $TX_B$.

In an image acquired by the I-TOF camera, the degree of saturation for each pixel varies depending on the state of a subject, that is, the distance to the subject and the color of the subject. For example, the whiter the color of the subject, the faster pixels responsible for white are saturated. Pixels responsible for black are less affected by background light. Therefore, it is preferable that each of the 2-tap pixel circuit 100, the in-pixel sigma delta circuit 200, the adaptive sigma delta controller 300, and the chopping controller 400 described above in the specification of the present disclosure may exist separately for each pixel. Then, it is possible to more effectively remove background light for each pixel to secure the range for distinguishing the black and white of a subject, for example, a dynamic range of 100 dB or more, and thus the circuits of the present disclosure can effectively cover an HDR signal area.

Although embodiments of the present disclosure have been described with reference to those illustrated in the drawings, these are for illustrative purposes only, and those skilled in the art will appreciate that various modifications and other equivalent embodiments are possible from the embodiments. Thus, the true technical scope of the present disclosure should be defined by the technical spirit of the appended claims.

What is claimed is:

1. A pixel circuit for background light suppression, the pixel circuit comprising:
   a 2-tap pixel circuit including first and second pixel capacitors, first and second storage switches, and first and second transfer switches;
   an in-pixel sigma delta circuit including a plurality of switching switches and a storage capacitor for storing charge transferred from the first and second pixel capacitors;
   an adaptive sigma delta controller configured to determine switching states of the plurality of switching switches according to a first state of the first pixel capacitor, or a second state of the second pixel capacitor, or both; and a chopping controller configured to instruct the storage switches and the transfer switches of the 2-tap pixel circuit to be selectively switched according to an output of the adaptive sigma delta controller.

2. The pixel circuit of claim 1, wherein the 2-tap pixel circuit, the in-pixel sigma delta circuit, the adaptive sigma delta controller, and the chopping controller are arranged for each pixel.

3. The pixel circuit of claim 1, wherein either the first storage switch or the second storage is turned on according to the instruction of the chopping controller.

4. The pixel circuit of claim 1, wherein connection states of both electrodes of the storage capacitor are reversed to each other by operations of the switching switches of the in-pixel sigma delta circuit.

5. The pixel circuit of claim 4, wherein the reverse connection is performed by reversing turn-on and turn-off states of the switching switches.

6. The pixel circuit of claim 5, wherein a part of the charge stored in the storage capacitor is removed by the reverse connection.

7. The pixel circuit of claim 1, wherein the first and second storage switches of the 2-tap pixel circuit are alternately turned on by an operation of the chopping controller.

8. The pixel circuit of claim 1, wherein the output of the adaptive sigma delta controller is determined according to a charge amount of one of the first and second pixel capacitors.

9. The pixel circuit of claim 1, wherein the output of the adaptive sigma delta controller is changed when a charge amount of one of the first and second pixel capacitors exceeds a preset threshold value.

10. The I-TOF pixel circuit of claim 1, wherein the chopping controller is further configured to instruct the switching switches in the in-pixel sigma delta circuit to be selectively switched.

11. The pixel circuit of claim 1, wherein the first storage switch and the first transfer switch of the 2-tap pixel circuit are alternately switched with the second storage switch and the second transfer switch, respectively.

12. The pixel circuit of claim 1, wherein, in a first signal sampling period, the chopping controller is further configured to form a first path coupling the first pixel capacitor to a first end of the storage capacitor and a second path coupling the second end of the storage capacitor to an output node of the in-pixel sigma delta circuit.

13. The pixel circuit of claim 12, wherein, in a second signal sampling period, the chopping controller is further configured to form a third path coupling the second pixel capacitor to the second end of the storage capacitor and a fourth path coupling the first end of the storage capacitor to the output node.

14. The pixel circuit of claim 1, wherein the plurality of switching switches of the in-pixel sigma delta circuit includes first, second, third, and fourth switching switches, the first switching switch being coupled between an input node and a first end of the storage capacitor, the second switching switch being coupled between a second end of the storage capacitor and an output node, the third switching switch being coupled between the input node and the second end of the storage capacitor, and the fourth switching switch being coupled between the first end of the storage capacitor and the output node.

15. The pixel circuit of claim 14, wherein, in a first signal sampling period, the chopping controller is further configured to form a first path coupling the first pixel capacitor to the first end of the storage capacitor through the first transfer switch and the first switching switch and a second path coupling the second end of the storage capacitor to the output node through the second switching switch.

16. The pixel circuit of claim 15, wherein, in a second signal sampling period, the chopping controller is further configured to form a third path coupling the second pixel capacitor to the second end of the storage capacitor through the second transfer switch and the third switching switch and a fourth path coupling the first end of the storage capacitor to the output node through the fourth switching switch.

17. The pixel circuit of claim 1, wherein the adaptive sigma delta controller is further configured to make the in-pixel sigma delta circuit perform switching operations of the plurality of switching switches by generating the output having a specific value, the specific value of the output of the adaptive sigma delta controller indicating that a charge amount of one of the first and second pixel capacitors exceeds a threshold value.

\* \* \* \* \*